United States Patent [19]
Hack et al.

[11] Patent Number: 5,717,223
[45] Date of Patent: Feb. 10, 1998

[54] ARRAY WITH AMORPHOUS SILICON TFTS IN WHICH CHANNEL LEADS OVERLAP INSULATING REGION NO MORE THAN MAXIMUM OVERLAP

[75] Inventors: Michael G. Hack, Mountain View; René A. Lujan, Santa Clara, both of Calif.

[73] Assignee: Xerox Corporation, Stamford, Conn.

[21] Appl. No.: 578,780

[22] Filed: Dec. 22, 1995

[51] Int. Cl.$^6$ ................................................ H01L 29/04
[52] U.S. Cl. ........................... 257/57; 257/59; 257/72; 359/59
[58] Field of Search ........................... 257/57, 59, 60, 257/61, 72, 347; 359/54, 59, 87

[56] References Cited

U.S. PATENT DOCUMENTS

| | | | |
|---|---|---|---|
| 5,274,250 | 12/1993 | Miyake et al. | 257/59 |
| 5,324,674 | 6/1994 | Possin et al. | 437/41 |
| 5,391,507 | 2/1995 | Kwasnick et al. | 437/41 |
| 5,396,072 | 3/1995 | Schiebel et al. | 250/370.09 |
| 5,462,885 | 10/1995 | Nasu et al. | 437/40 |
| 5,466,620 | 11/1995 | Bang | 437/51 |
| 5,471,330 | 11/1995 | Sarma | 359/59 |
| 5,473,168 | 12/1995 | Kawai et al. | 257/61 |
| 5,486,939 | 1/1996 | Fulks | 359/74 |
| 5,491,347 | 2/1996 | Allen et al. | 257/59 |

OTHER PUBLICATIONS

Kanichi, J., Hasan, E., Griffith, J., Takamori, T., and Tsang, J.C., "Properties of High Conductivity Phosphorous Doped Hydrogenated Microcrystalline Silicon and Application in Thin Film Transistor Technology," *Mat. Res. Soc. Symp. Proc.*, vol. 149, 1989, pp. 239–246.

Lustig, N., and Kanicki, J., "Gate dielectic and contact effects in hydrogenated amorphous silicon–silicon nitride thin film transistors," *J. Appl. Phys.*, vol. 65, May 1989, pp. 3951–3957.

Wu, I-W., Lewis, A.G., Huang, T.-Y., and Chiang, A., "Performance of Polysilicon TFT Digital Circuits Fabricated with Various Processing Techniques and Device Architectures," *SID 90 Digest*, 1990, pp. 307–310.

Miura, Y., Jinnai, T., Kakkad, R., and Ibaraki, N., "A Five-Mask a-Si TFT-Array Process with ITO-Metal Double-Layer Data-Lines and Poly-Si Source-Drains," *AM-LCD 95 Digest of Technical Papers*, Aug. 1995, pp. 75–78.

Tanaka, Y., Shibusawa, M., Dohjo, M., Tomita, O., Uchikoga, S., and Yamanaka, H., "A 13.8-in.-Diagonal High-Resolution Multicolor TFT-LCD for Workstations," *SID 92 Digest*, May 1992, pp. 43–46.

*Primary Examiner*—Minh-Loan Tran

[57] ABSTRACT

An array includes cells, each with a bottom gate amorphous silicon thin film transistor (a-Si TFT). Each a-Si TFT has an undoped amorphous silicon layer over its gate region and extending beyond its edges. Each a-Si TFT also has an insulating region with edges approximately aligned with the edges of its gate region. Two channel leads of doped semiconductor material such as microcrystalline silicon or polycrystalline silicon are on the undoped amorphous silicon layer, each overlapping an edge of the insulating region by a distance that is no more than a maximum overlap distance, which in turn is no more than 1.0 μm.

16 Claims, 6 Drawing Sheets

ARRAY WITH AMORPHOUS SILICON TFTS IN WHICH CHANNEL LEADS OVERLAP INSULATING REGION NO MORE THAN MAXIMUM OVERLAP

BACKGROUND

The present invention relates to circuitry fabricated on a substrate.

Kanicki, J., Hasan, E., Griffith, J., Takamori, T., and Tsang, J. C., "Properties of High Conductivity Phosphorous Doped Hydrogenareal Microcrystalline Silicon and Application in Thin Film Transistor Technology," *Mat. Res. Soc. Symp. Proc.*, Vol. 149, 1989, pp. 239–246, describe techniques for phosphorous (P) doping of microcrystalline silicon. At pages 239 and 245, Kanicki et al. describe use of a heavily (n+) P-doped layer in a hydrogenated amorphous silicon (a-Si:H) thin film transistor (TFT) as a contact interlayer between a source/drain metal and a-Si:H layer, and mention application in flat panel liquid crystal displays (LCDs). At pages 245 and 246, Kanicki et al. describe application of such a layer to a TFT structure, mentioning a gate to source-drain overlap of about 5 micron.

Lustig, N., and Kanicki, J., "Gate dielectric and contact effects in hydrogenated amorphous silicon-silicon nitride thin-film transistors," *J. Appl. Phys.*, Vol. 65, May 1989, pp. 3951–3957, describe improvement in TFT mobility upon replacement of phosphorous doped (n+) hydrogenareal amorphous silicon (a-Si:H) by n+ hydrogenareal microcrystalline silicon (μc-Si:H) in source-drain contact fabrication. Section II on pages 3951 and 3952 describes an experiment that included a thin n+ μc-Si:H layer between source-drain metal and intrinsic a-Si:H, to insure ohmic contacts. The n+ μc-Si:H was deposited from a PH$_3$/SiH$_4$ mixture in H$_2$ yielding an approximately 0.1-Ω cm material. The upper part of FIG. 1 shows a schematic cross section of a resulting transistor. Section III mentions that the devices had a width of 50 μm, a channel length of 20 or 40 μm, and a gate to source-drain overlap of approximately 5 μm, and that the TFTs are suitable for addressing flat panel LCD displays. As shown and described in relation to FIG. 5, average field-effect mobility increased with n+ μc-Si:H.

SUMMARY OF THE INVENTION

The invention addresses problems in array circuitry fabricated on a substrate.

Each cell of an active matrix array includes a component and a switching element that controls connection between the component and a line, often called a "data line," under control of another line, often called a "scan line." If the array is fabricated on a substrate, the switching element may be a thin film transistor (TFT). Various types of amorphous silicon (a-Si) TFTs are commonly used as switching elements in active matrix arrays.

Performance of an a-Si TFT depends heavily on the relative lateral positions of the edges of the TFT's gated region and the boundaries or junctions between the TFT's doped channel leads and the undoped region that includes the TFT's channel. If the source-side boundary or junction is outside the edge of the gated region, contact resistance is poor; in the limit, the gate cannot control the state of the channel as required for proper device operation. On the other hand, if a TFT's gated region extends beyond the boundary or junction at either side of the channel or in some other way overlaps one or both doped channel leads, unnecessary excess geometric capacitance occurs; if the extent of this overlap, referred to herein as "gate/channel lead overlap," is not precisely controlled, capacitance will vary, producing intra-cell variations within the array.

The bottom gate a-Si TFTs of Kanicki et al. and Lustig et al., described above, could be used as switching elements, but the TFTs have gate/channel lead overlap of about 5 μm and channel lengths of 20 μm. Gate/channel lead overlap of 5 μm is sufficient to cause performance problems. In addition, the gate/channel lead overlap occurs because the doped semiconductor material of each channel lead extends over an edge of an insulating region that is approximately aligned with an edge of the gate region. For channel lengths significantly shorter than 20 μm, this amount of gate/channel lead overlap could result in shorts between the channel leads, leading to inoperative TFTs.

The invention is based on the discovery of a technique that alleviates the problem of excessive gate/channel lead overlap. The technique can improve arrays of self-aligned bottom gate a-Si TFTs by limiting gate/channel lead overlap uniformly across an array, avoiding unnecessary excess geometric capacitance. In addition, the technique makes it possible to reduce channel length in a-Si TFTs, thus improving performance.

The technique can be implemented as an improvement in an array of the type in which a cell includes a bottom gate a-Si TFT. Each a-Si TFT has a gate region with first and second edges, an undoped amorphous silicon layer with first and second parts that extend beyond its edges, an insulating region over the amorphous silicon layer with edges approximately aligned with the gate region's edges, and first and second channel leads of doped semiconductor material over the first and second parts of the amorphous silicon layer. The improvement is that each channel lead overlaps the insulating region by a distance that is no more than a maximum overlap distance. The maximum overlap distance is no more than 1.0 μm.

The insulating region can have a width between its edges of approximately 5.0 μm. The maximum overlap distance can be 0.5 μm. The doped semiconductor material can be microcrystalline silicon or polycrystalline silicon. The insulating material can be silicon nitride. A conductive metal electrode can be electrically connected to each channel lead.

The technique can provide an array in which each cell includes an a-Si TFT. The technique could be applied, for example, in a light valve array for an AMLCD.

The technique described above is advantageous because it can provide an array in which a fully self-aligned a-Si TFT has minimal geometric capacitance due to gate/channel lead overlap. The TFT has high mobility, and can have a very short channel for improved performance. The technique is highly compatible with conventional techniques for producing a-Si TFTs.

The technique is further advantageous because it can provide an array across which a-Si TFTs have uniform parameters.

The following description, the drawings, and the claims further set forth these and other aspects, objects, features, and advantages of the invention.

DETAILED DESCRIPTION

A. Conceptual Framework

Figure 1:
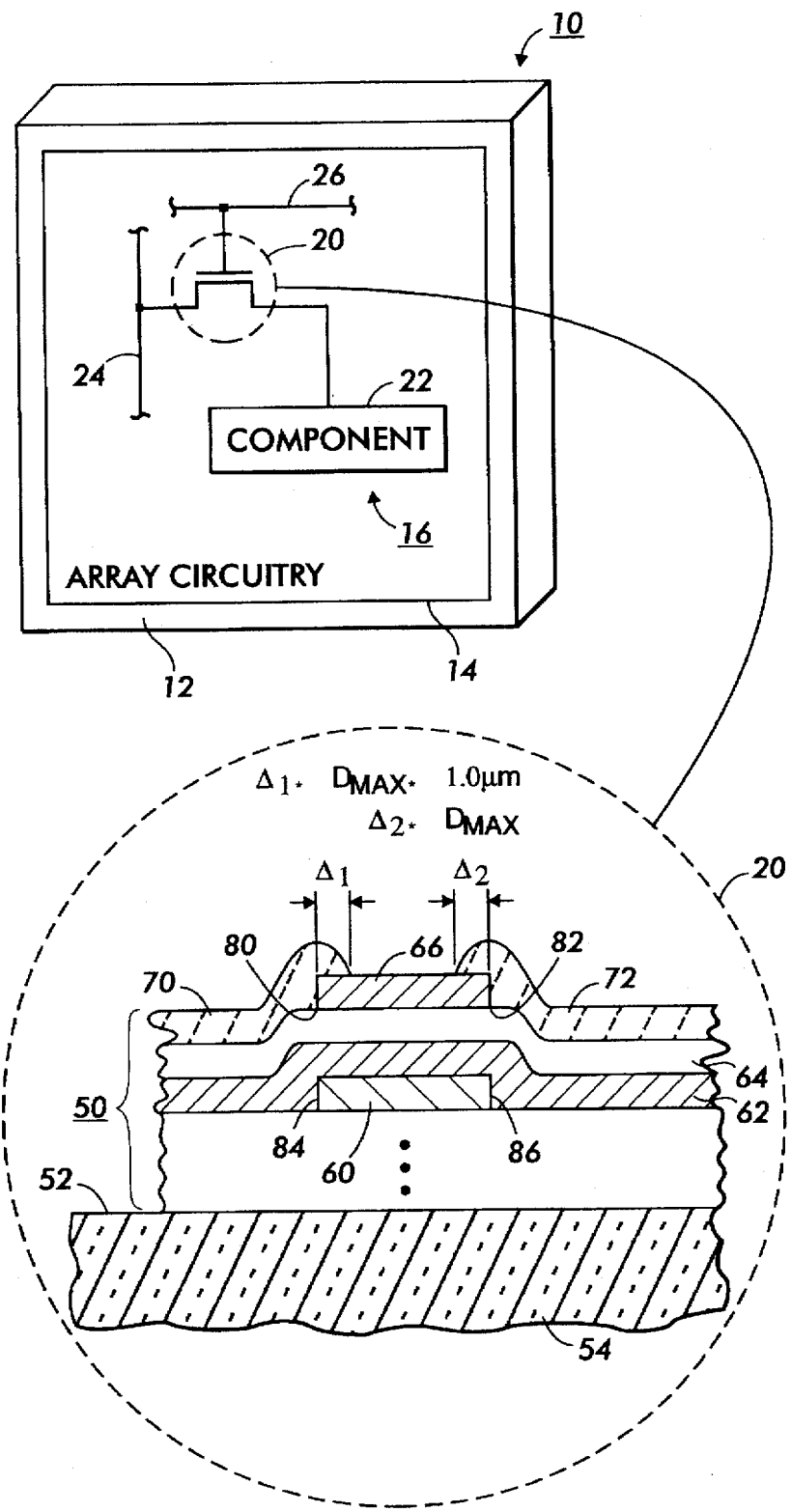
FIG. 1 is a schematic diagram showing an array in which an a-Si TFT has channel leads that overlap an insulating region by no more than a maximum overlap distance of 1.0 μm.

The following conceptual framework is helpful in understanding the broad scope of the invention, and the terms defined below have the indicated meanings throughout this application, including the claims.

"Circuitry" or a "circuit" is any physical arrangement of matter that can respond to a first signal at one location or time by providing a second signal at another location or time, where the timing or content of the second signal includes information about timing or content of the first signal. Circuitry "transfers" a first signal when it receives the first signal at a first location and, in response, provides the second signal at a second location.

Any two components are "connected" when there is a combination of circuitry that can transfer signals from one of the components to the other. For example, two components are "connected" by any combination of connections between them that permits transfer of signals from one of the components to the other. Two components are "electrically connected" when there is a combination of circuitry that can transfer electric signals from one to the other. Two components could be electrically connected even though they are not in physical contact, such as through a combination of conductive components that are electrically connected between them.

An "electric circuit" is a circuit within which components are electrically connected. An "electric structure" is a physical structure that includes one or more electric circuits.

A "substrate" or "chip" is a unit of material that has a surface at which circuitry can be formed or mounted. An "insulating substrate" is a substrate through which no electric current can flow.

An "integrated circuit" is a circuit formed at a substrate's surface by batch processes such as deposition, lithography, etching, oxidation, diffusion, implantation, annealing, and so forth.

A "layer" is a thickness of material formed over a surface and extending generally parallel to the surface, with one side toward the surface and another side away from the surface. A layer may include two or more layers within it, referred to as "sublayers." A layer may be homogeneous or its composition may vary.

To "etch" is to remove parts of one or more layers of material.

An "etchant" is a fluid used to etch.

To perform "physical vapor deposition" is to cause a material to be deposited on a physical structure without a chemical reaction. Examples include sputtering, vacuum evaporation, and e-beam deposition.

To perform "chemical vapor deposition" is to cause a material to be deposited on a physical structure by use of reactant gases and an energy source to produce a gas-phase chemical reaction. The energy source could be thermal, optical, or plasma in nature; "plasma enhanced chemical vapor deposition" or "PECVD" uses a plasma energy source. A "PECVD layer" is a layer produced by PECVD.

An operation "deposits" a layer by depositing material to form the layer, such as by physical or chemical vapor deposition.

To perform "lithography" or to "lithographically pattern" is to use a radiation source to transfer a mask pattern to a layer of radiation-sensitive material and then to develop the radiation-sensitive material to obtain a positive or negative copy of the mask pattern. The radiation-sensitive material is referred to as "resist" or "photoresist." The process of transfering a mask pattern to a resist layer is referred to herein as "exposure," and parts of a resist layer that receive radiation during exposure are referred to herein as "photoexposed." A fluid used to develop a resist is referred to as a "developer." A "positive resist" is a resist for which a developer can remove photoexposed parts much more quickly than parts that are not photoexposed. A "negative resist" is a resist for which a developer can remove parts that are not photoexposed much more quickly than photoexposed parts. If it is to be used for etching, a pattern of resist that results from development may be referred to as a "pattern of mask material" or simply a "mask."

In lithography, "backside exposure" is exposure of a resist layer in a structure on a substrate, where radiation reaches the resist layer through the substrate. A part of a layer between the resist layer and the substrate can provide a mask pattern if it prevents radiation from reaching the resist layer in areas over it.

An operation "forms" a patterned layer or circuitry in a layer by performing lithography to produce a pattern of mask material and then etching away either the part of the layer that is not covered by the pattern or the part that is covered.

A "thin-film structure" is an electric structure that is formed at a surface of an insulating substrate. A thin-film structure could be formed, for example, by deposition and patterned etching of films on the insulating substrate's surface.

A "lead" is a part of a component at which the component is electrically connected to other components. A "line" is a simple component that extends between and electrically connects two or more leads. A line is "connected between" the components or leads it electrically connects. A lead of a component is "connected" to a lead of another component when the two leads are electrically connected, such as by a combination of leads and lines. In an integrated circuit, leads of two components may also be "connected" by being formed as a single lead that is part of both components.

The terms "array" and "cell" are related: An "array" is an article of manufacture that includes an arrangement of "cells." For example, a "two-dimensional array" or "2D array" includes an arrangement of cells in two dimensions. A 2D array of circuitry may include rows and columns, with a line for each row and a line for each column. Lines in one direction may be "data lines" through which a cell receives or provides signals that determine or indicate its state. Lines in the other direction may be "scan lines" through which a cell receives a signal enabling it to receive signals from or provide signals to its data line.

In an array of circuitry, "cell circuitry" is circuitry connected to a cell's scan line and data line.

In a thin film structure, the terms "gate region," "gated region," and "channel" have related meanings: A "gate region," sometimes called a "gate," is a part of a layer that controls conductivity of a "gated region" that is part of another layer, typically defined by the projection of the gate region onto the other layer; conversely, a "gated region" is a part of a layer with conductivity that changes depending on the gate region; a "channel" is formed when current flows through a gated region. A channel is "highly conductive" or "ON" when the channel is in a state in which current can flow freely through it. A channel is "OFF" when the channel is in a state in which very little current can flow through it.

A "channel lead" is a lead that electrically connects to a channel. A channel may, for example, extend between two channel leads.

A "charge carrier" is a real or fictitious particle that can transport charge to produce a current; electrons and holes are examples of charge carriers. A "charge carrier source" is an ion, atom, molecule, or other feature that can provide a charge carrier. A "charge carrier destination" is an ion, atom, molecule, or other feature that can neutralize or stop movement of a charge carrier. In an integrated circuit, an "n-channel" is a channel for which the majority of charge carrier sources provide charge carriers of negative sign such as electrons; a "p-channel" is a channel for which the majority of charge carrier sources provide charge carriers of positive sign such as holes.

A "dopant particle" or "dopant" is an ion, atom, molecule, or other particle that can be added to a channel or other part of an integrated circuit during fabrication and that serves as a charge carrier source when the integrated circuit is in use. An "n-type dopant" provides charge carriers of negative sign and a "p-type dopant" provides charge carriers of positive sign.

A layer or part of a layer is "doped" if it contains dopant and "undoped" if it does not.

A "transition" or "junction" occurs where a doped channel lead meets an undoped layer of material that includes a gated region. The channel lead "extends away from" the transition or junction.

A "transistor" is a component that has a channel or a series of channels that extends between two channel leads, and that also has a third lead-referred to as a "gate lead" or simply "gate"—such that the channel or series of channels can be switched between ON and OFF by signals that change potential difference between the gate and one of the channel leads, referred to as the "source." The channel lead that is not the source is referred to as the "drain." Other components may have leads called gates, sources, and drains by analogy to transistors.

Signals on a line "control conductivity" of a channel if the signals can change conductivity of the channel. Such a line may be called a "gate line" and the signals may be called "gate signals." In an array in which the gates of transistors that control a row of elements are connected to such a line, it is more common to call the line a "scan line" and the signals "scan signals."

Two components are electrically connected "under control of" a line if a signal on the line can change conductivity of a third component connected between the two components so that the two components are electrically connected. For example, circuitry that includes a channel or series of channels can electrically connect two components under control of a line that is electrically connected to one or more gate regions that control conductivity of the channel or series of channels.

In a thin-film structure at a surface, a part of a first layer "covers" or "has a shape that covers" or "is over" a part of a second layer if the part of the second layer is between the part of the first layer and the surface.

An "insulating layer" is a layer formed of a nonconductive material.

A part of a layer "has an edge" if another, complementary part of the layer has been removed by one or more processes, leaving the part of the layer. The edge is the boundary between part of a layer and its complementary part.

A part of a layer is "exposed" when it is not covered by any other layer. For example, it may be exposed as a result of one or more processes that removed another layer from over it. Such processes can be said to "expose" the part.

A part of a first layer "overlaps" a part of a second layer if the part of the first layer is over and extends beyond an edge of the part of the second layer, but has an edge inside the edge of the part of the second layer. The "overlap distance" or "distance" by which the first layer overlaps the second layer is the maximum distance from the edge of the second layer inward to the edge of the first layer. A "maximum overlap distance" is an overlap distance that cannot be exceeded. For example, it may not be possible to reliably fabricate a device or a device may not function properly if a maximum overlap distance is exceeded.

An operation "controls" an overlap distance if the operation is one of a set of one or more operations that determine the size of the overlap distance.

Edges of two layers or parts of layers in a structure formed on a substrate are "approximately aligned" if their projections onto the surface of the substrate at which the structure is formed are approximately the same.

Edges of two layers or parts of layers are "self-aligned" if they are approximately aligned because one was produced by a photolithographic process in which the other served as a mask.

A "thin film transistor" or "TFT" is a transistor that is part of a thin-film structure.

An "amorphous silicon thin film transistor" or "a-Si TFT" is a TFT with a gated region that is part of a layer of amorphous silicon, so that the TFT's channel is formed in amorphous silicon.

B. General Features

FIG. 1 shows general features of the invention. FIG. 1 shows an array in which an a-Si TFT has channel leads that overlap an insulating region by a distance that is no more than a maximum overlap distance. The maximum overlap distance is no more than 1.0 μm.

Array 10 in FIG. 1 includes substrate 12 in a surface of which array circuitry 14 is formed. Array circuitry 14 includes cells, with representative cell 16 being shown in more detail.

Cell 16 includes a-Si TFT 20 and component 22, with one of the channel leads of a-Si TFT 20 illustratively connected to component 22. The other channel lead is illustratively connected to line 24 and the gate lead is illustratively connected to line 26, so that a-Si TFT 20 provides an electrical connection between line 24 and component 22 under control of line 26.

FIG. 1 also shows a-Si TFT 20 in cross section. Thin film structure 50 on surface 52 of substrate 54 includes gate region 60, insulating layer 62, undoped amorphous silicon layer 64, insulating region 66, and channel leads 70 and 72. Insulating region 66 has edges 80 and 82, approximately aligned with edges 84 and 86, respectively, of gate region 60. Channel leads 70 and 72 have overlapping parts 90 and 92, respectively, which overlap insulating region 66 by distances A1 and A2, respectively. As shown, $\Delta_1$ and $\Delta_2$ are each no more than a maximum overlap distance $D_{MAX}$, and $D_{MAX}$ is no more than 1.0 μm.

C. Implementation

The general features described above could be implemented in numerous ways in an array with a-Si TFTs that have channel leads that overlap an insulating region by a distance not exceeding the maximum overlap distance no greater than 1.0 μm. The implementation described below produces an active matrix array on an insulating substrate.

C.1. Fabrication

Figure 2:
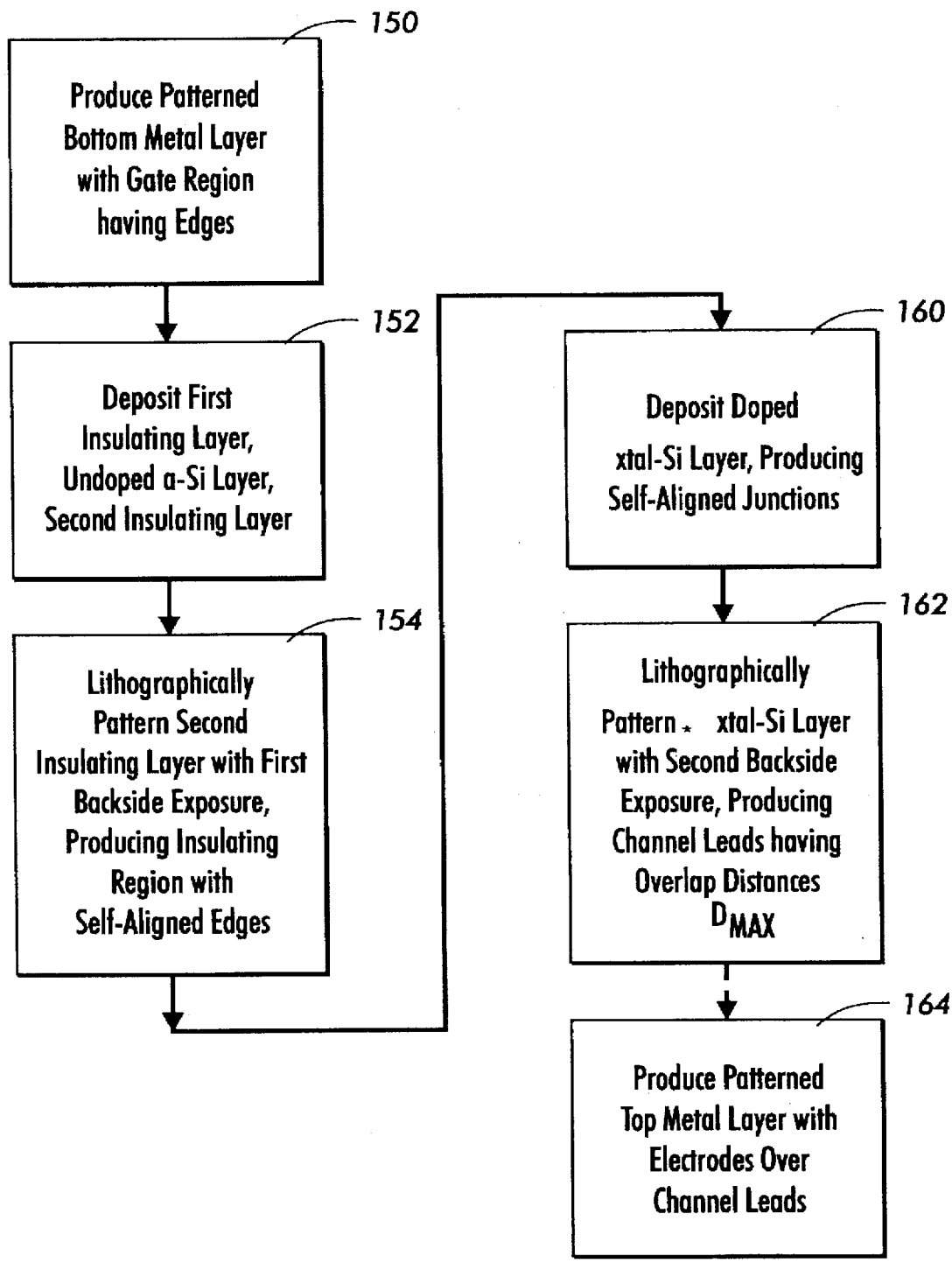
FIG. 2 is a flow diagram showing acts in producing an a-Si TFT with channel leads overlapping an insulating region by no more than a maximum overlap distance.
Figure 3:
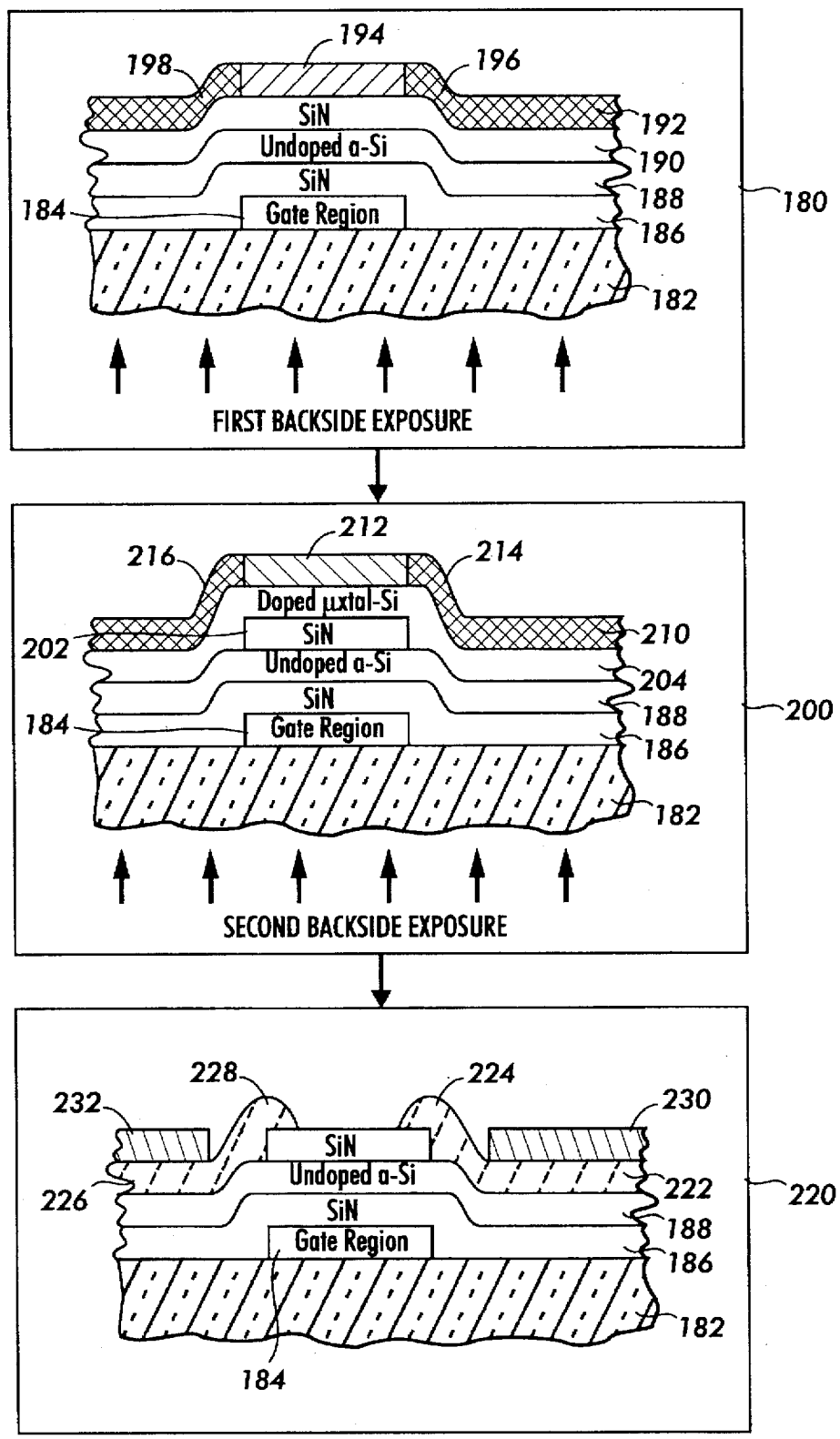
FIG. 3 is a flow diagram showing cross sections of stages in performing the acts in FIG. 2.

FIGS. 2 and 3 illustrate a fabrication technique that implements the general features described above. FIG. 2 shows acts in producing an active matrix array on an insulating substrate. FIG. 3 shows several stages in performing the acts in FIG. 2.

The act in box 150 in FIG. 2 begins by producing a bottom metal pattern that forms a scan line for each row of cells in an active matrix array and, for each cell, a gate lead that includes a gate region. The act in box 150 can be implemented by depositing metal using a physical vapor deposition process such as sputtering. The metal can be MoCr, TiW, Al, Al with a TiW capping layer, or another appropriate scan line metal, deposited to a thickness of 400–2000 angstroms. 1000 angstroms of MoCr, for example, is an appropriate metal as described in copending coassigned U.S. patent application No. 08/235,008, entitled "Thin-Film Structure with Conductive Molybdenum-Chromium Line," incorporated herein by reference. The metal can then be lithographically patterned. In current implementations, typically distances between gate region edges are approximately 10 μm, with distances of 5 μm and less being attainable in the near future.

The act in box 152 then produces a bottom nitride layer, an amorphous silicon layer, and a top nitride layer. The act in box 152 has been implemented with plasma chemical raper deposition (CVD) using a trilayer deposition or etch stop process that deposited three layers in sequence without breaking vacuum. The bottom nitride layer can be silicon nitride deposited at 300°–380° C. to obtain a thickness of 3000 angstroms. The amorphous silicon layer can be deposited at 230°–300° C. with 5–12% hydrogen, with a thickness of 300–500 angstroms. The top nitride layer can be silicon nitride deposited at 200°–250° C. to obtain a thickness of 1000–1500 angstroms.

The act in box 154 then lithographically patterns the top nitride with self-aligned backside exposure and top masked exposure of a positive photoresist. The backside exposure defines the self-aligned edges of an insulating region at which junctions will be formed, and the top masked exposure defines the other two edges of the insulating region. The act in box 154 can use a wet etch with a 10:1 buffered oxide etch such as 10 parts ammonium fluoride per part of HF for approximately 2.5 minutes or until the oxide is removed, as indicated by water sheeting off so that the surface is not wet when removed from the etchant, to obtain a self-aligned insulating region over the gate region. The act in box 154 can also include cleaning with a solution of 200 parts water per part of HF to remove native oxide; here again, the etch can continue until the oxide is removed as indicated by water sheeting off.

The acts in boxes 160 and 162 then produce a pattern of doped μxtal-Si, providing self-aligned channel leads that overlap the self-aligned insulating region by no more than a maximum overlap distance of 1.0 μm.

The act in box 160 deposits a layer of doped μxtal-Si to produce self-aligned junctions at the edges of the insulating region. Deposition of μxtal-Si can be implemented by first performing plasma CVD with SiH₄, PH₃, and H₂ at a high deposition power to deposit a heavily n+ doped μxtal-Si layer at 200°–250° C. with 5–15% hydrogen to a thickness of 500–1000 angstroms. The μxtal-Si layer should be thin enough to let light through, yet thick enough to be sufficiently conductive to function as a channel lead. The proportions of gases should be chosen to obtain an appropriate grain size and an appropriate level of dopant. The μxtal-Si layer can be doped, for example, with 0.5–2% phosphorous.

The act in box 160 could alternatively deposit poly-Si, which has adequate conductivity, or another highly conductive semiconductor material. A heavily n+ doped a-Si layer, however, would not be sufficiently conductive at this scale to carry current between the a-Si channel and subsequently formed metal electrodes without introducing a large series resistance—the metal is patterned to have an edge separated from the self-aligned edge of the insulating region by a sufficient alignment tolerance to avoid errors in which the metal overlaps the insulating region and causes additional capacitance.

The act in box 162 lithographically patterns the μxtal-Si layer by self-aligned backside exposure and top masked exposure of a conventional negative photoresist that behaves like a positive resist in process to avoid use of problematic developers such as phenol and xylene. The backside exposure defines the self-aligned edges of channel leads that will overlap the insulating region, and the top masked exposure defines the other edges of the channel leads. The act in box 162 can etch to remove the μxtal-Si layer over the insulating region, which acts as an etch stop, and to remove both the μxtal-Si layer and the a-Si layer elsewhere. During backside exposure, application of developer, baking, and application of etchant, the operator can observe the structure through a microscope and time each operation to obtain an overlap distance that does not exceed the maximum overlap distance. Appropriate times will depend on such factors as intensity of backside illumination, concentrations of developer and etchant, and temperature of baking. With standard illumination, for example, 60 sec of backside exposure can produce an overlap distance as large as 1 μm; in general, the overlap distance is proportional to the length of backside exposure.

An etch technique can be chosen that obtains the desired overlap distance. Reactive ion etching produces a vertical profile because it is highly anisotropic, rapidly etching downward and only slowly etching sideways, while chemical and barrel etching are isotropic and produce more undercut. Therefore, reactive ion etching can be more easily timed to control overlap.

The act in box 162 can also include another lithographic process that cuts vias through the bottom nitride layer in appropriate locations to allow electrical connections with the bottom metal pattern.

For uniform overlap distances, all the lithographic processes performed in box 162 must be performed uniformly over the array.

The act in box 164 produces a top metal pattern, including electrodes that are over the channel leads formed in box 162, for electrically connecting the junctions to other components such as a cell's circuitry and a data line. To prevent top metal from overlapping the insulating region, the electrodes are pulled back from the edge of the insulating region by at least 2 μm. The top metal can be the same as the bottom metal in box 150, and can have a thickness of 400–2000 angstroms.

Figure 4:
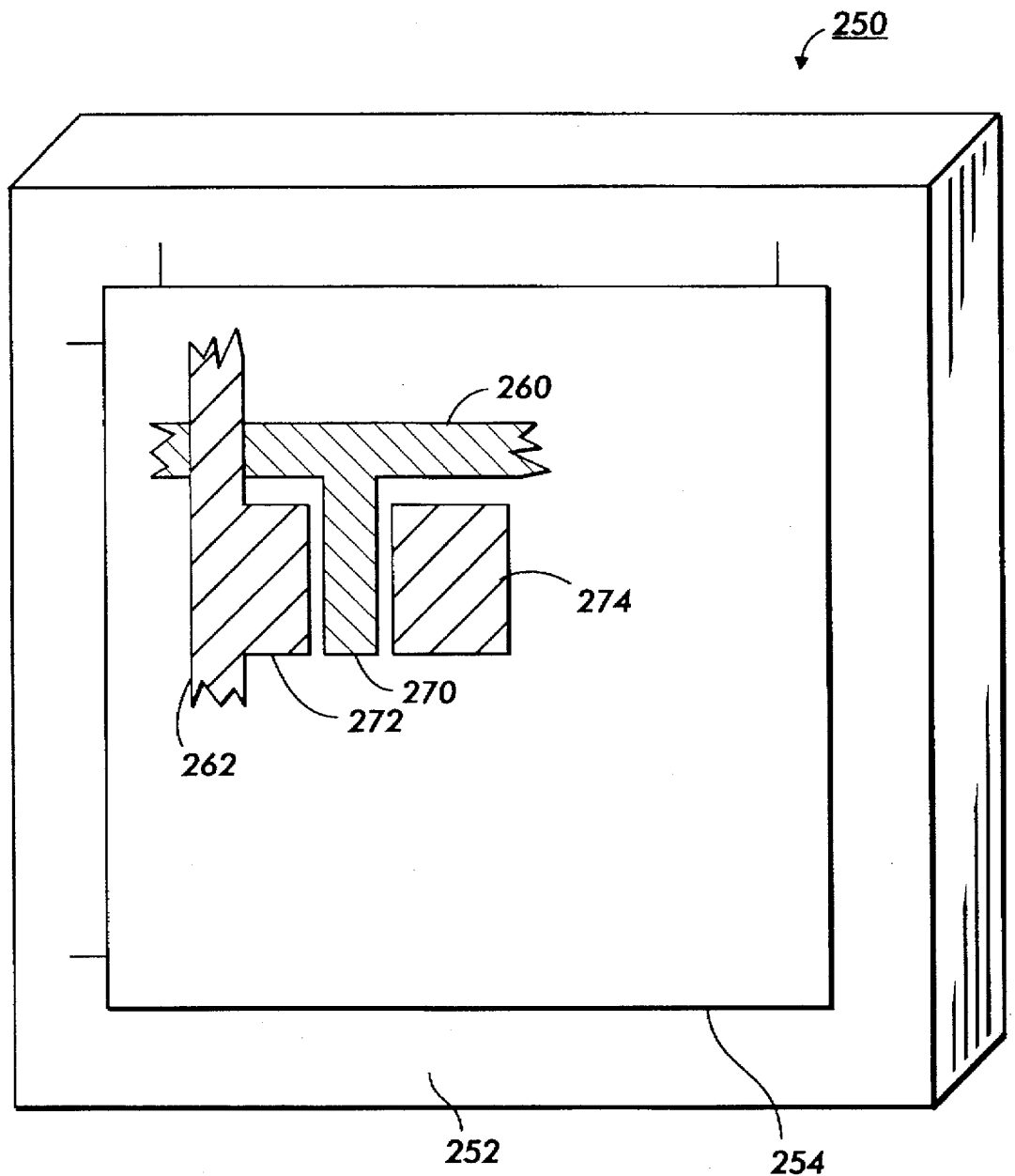
FIG. 4 is a schematic diagram of an array produced in accordance with FIG. 2.

The manner in which the array can be used to produce an active matrix LCD and further details of the technique in FIG. 2 can be understood from the description of FIG. 4 of copending coassigned U.S. patent application No. 08/235,011, now issued as U.S. Pat. No. 5,491,347 entitled "Thin-Film Structure With Dense Array of Binary Control Units for Presenting Images" ("the Dense Array Application"), incorporated herein by reference. For example, as suggested by the dashed line from box 162 to box 164, additional acts could be performed after box 162 and before box 164. The act in box 164 can also be followed by conventional acts including passivation and so forth.

FIG. 3 shows stages in the implementation of FIG. 2.

Cross section 180 in FIG. 3 shows the first backside exposure, in box 154. As in the other stages, a structure is formed on a surface of substrate 182, with gate region 184 formed in box 150 and layers 186, 188, and 190 formed in box 152. Prior to the first backside exposure, the act in box 154 deposits positive photoresist layer 192. Part 194 of layer 192 is not photoexposed, but parts 196 and 198 are photoexposed.

Cross section 200 shows the second backside exposure, in box 162. The act in box 154 develops photoresist layer 192, removes part 194, and then etches away exposed parts of SiN layer 190, producing insulating region 202 with self-aligned edges. The act in box 160 then deposits doped µxtal-Si layer 204, producing self-aligned junctions at the edges of insulating region 202. Prior to the second backside exposure, the act in box 162 deposits negative photoresist layer 210. Part 212 of layer 210 is not photoexposed, but parts 214 and 216 are photoexposed.

Cross section 220 shows the structure after the act in box 164. The act in box 162 develops photoresist layer 210, removes parts 214 and 216, and then etches away exposed parts of µxtal-Si layer 204, producing channel lead 222 with overlap 224 and channel lead 226 with overlap 228. The lithographic patterning is performed in such a way that overlaps 224 and 228 do not exceed a maximum overlap distance. The act in box 164 then produces electrodes 230 and 232, parts of the top metal layer that are electrically connected to the self-aligned junctions through channel leads 222 and 226.

C.2. Array with a-Si TFTs

FIG. 4 shows array product 250, which could be produced with the techniques described above in relation to FIGS. 2 and 3.

Array product 250 includes substrate 252 with array region 254 in which scan lines extend left to right and data lines extend top to bottom, so that each scan line crosses each data line. FIG. 4 also shows a layout of the top and bottom metal layers in the area where a representative scan line 260 crosses a representative data line 262.

The bottom metal layer includes scan line 260 and also gate region 270. Gate region 270 can have an appropriate width for the device being fabricated—its width determines the length of the channel of the a-Si TFT formed over it.

The top metal layer includes data line 262 and also channel electrodes 272 and 274. Data line 262 can have the same width as scan line 260, but channel electrodes 272 and 274 can have a width larger or greater than the width of the channel of the a-Si TFT, which must be sufficient to meet the current requirement of the device being fabricated. In addition, the spacing from channel electrode 272 to the edge of gate region 270 and the spacing from channel electrode 274 to the edge of gate region 270 can each be 2 µm to avoid errors in which channel electrodes 272 and 274 extend over the insulating region, increasing capacitance. These dimensions are merely illustrative, of course; in practice, the TFT will be dimensioned to provide the necessary current for proper device operation.

As can be understood from FIG. 4, the a-Si TFT connects data line 262 to a cell's circuitry (not shown) under control of gate line 260. When the a-Si TFT is ON due to a signal on gate line 260, the channel of the a-Si TFT provides an electrical connection between channel electrodes 272 and 274. Channel electrode 272 in turn is electrically connected to data line 262, and channel electrode 274 is electrically connected to the cell's circuitry.

An example of cell circuitry that could be used in an active matrix liquid crystal display (AMLCD) is described in relation to FIG. 3 of the Dense Array Application.

C.3. Test Results

Figure 5:
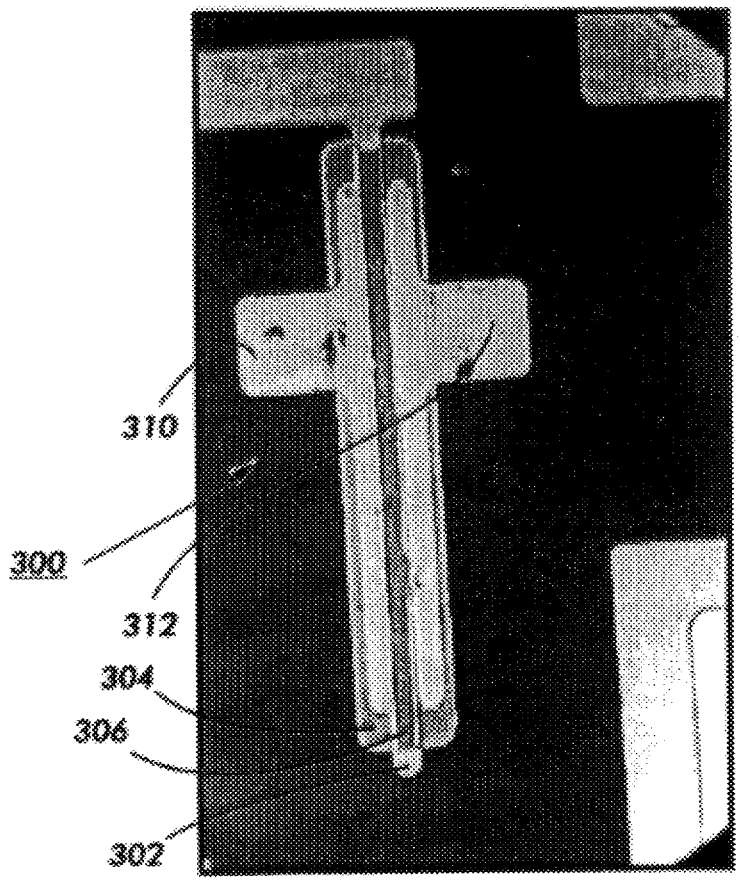
FIG. 5 is a microscopic photograph showing a structure in which channel leads overlap an insulating region by no more than a maximum overlap distance.
Figure 6:
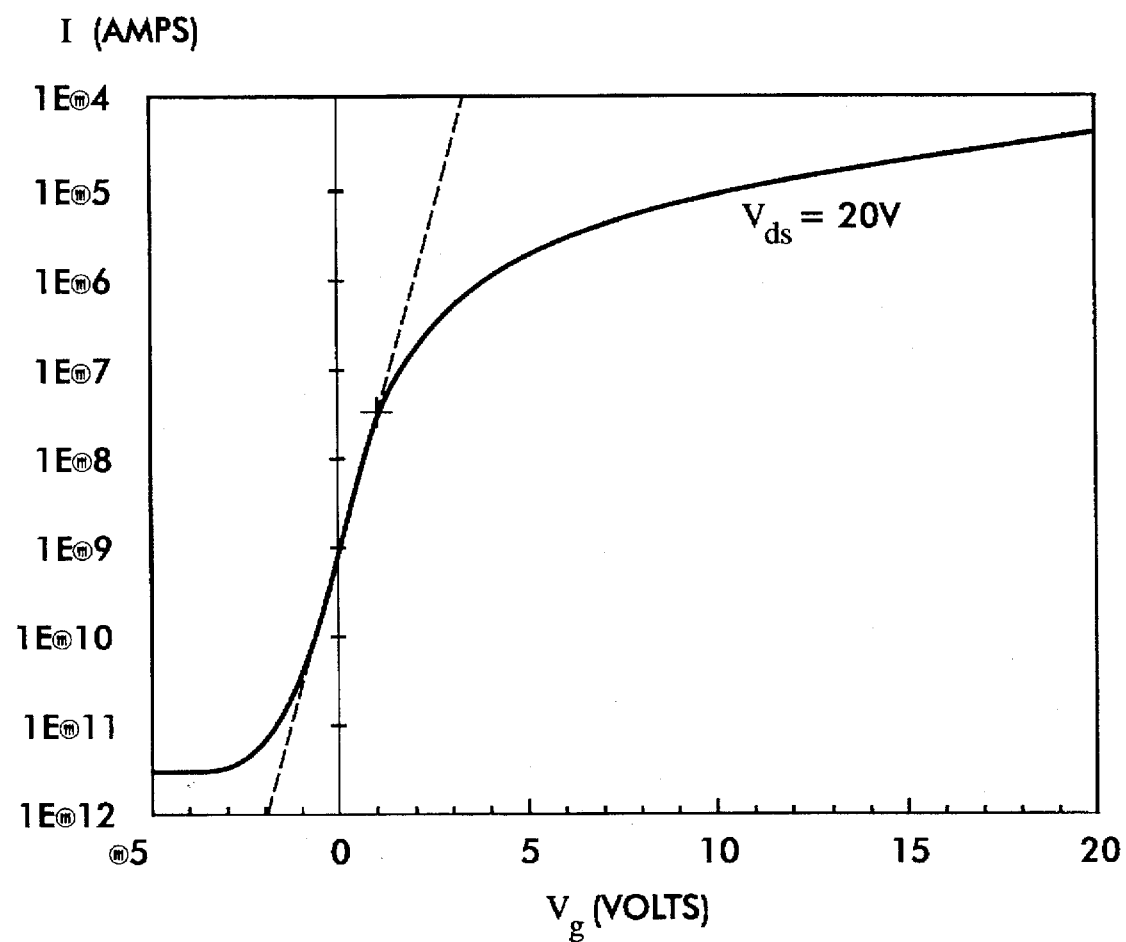
FIG. 6 is a graph showing current-voltage characteristics of a structure like that in FIG. 5.

An implementation of devices with features as described above has been built and tested. FIG. 5 shows a structure produced by implementing a device as described above. FIG. 6 shows current-voltage characteristics of a structure like that in FIG. 5.

The microscopic photograph in FIG. 5 shows device 300 successfully produced using a fabrication process similar to that described above in relation to FIGS. 2 and 3. Line 302 is a long, narrow line formed in a bottom metal layer and covered by layers 304, an undoped a-Si layer covered by a PECVD layer of doped µxtal-Si. The pattern of doped µxtal-Si is formed using backside exposure to obtain self-aligned edges that overlap the self-aligned edges of insulating region 306.

The area in which layers 304 cover line 302 defines a gate region of line 302 and a gated region of the undoped a-Si layer, each with dimensions approximately 98 µm×5 µm. Over the gated region of the undopeal a-Si layer is insulating region 306, formed in a layer of SiN using backside exposure to obtain self-aligned edges. As can be seen from FIG. 5, the PECVD layer of doped µxtal-Si overlaps insulating region 306 by distances that are generally less than 0.5 µm and that are less than 1.0 µm along the entire length of insulating region 306. The overlap distances were obtained by microscopically examining the device during etching, judging visually when an appropriate overlap distance had been obtained. This suggests that more precise fabrication techniques will allow smaller values for $D_{MAX}$, such as 0.5 µm.

The overlap shown in FIG. 5 is sufficient to provide a tolerance that prevents etching of the undoped a-Si layer for devices in an array, yet is small enough to avoid shorts across insulating region 306 and to minimize capacitance. If there were no overlap, extremely slight alignment errors across an array of devices would lead to defects due to etching of undoped a-Si at a junction. Channel electrodes 310 and 312 are formed in a top metal layer to permit electrical connections so that device 300 can be tested. A similar device has measured mobility of 0.59 $cm^2$/V-sec. The device's current-voltage performance is shown in FIG. 6, which shows that the device exhibited low OFF current and high ON current at a drain-source voltage of 20V.

C.4. Variations

The implementation described above could be changed in many ways within the scope of the invention.

The above implementation uses particular materials in a thin-film structure, but other materials could be used. For example, different metals could be used in the bottom and top metal layers, or other conductive materials could be used rather than metal, such as a thick layer of heavily doped silicon provided it is thick enough to prevent photoexposure of resist. Different insulating materials could be used. The channel leads could be formed from a different doped semiconductor material, provided it is sufficiently conductive.

The above implementation uses particular processes to produce a thin-film structure, but other processes could be used. In some cases, for example, acts could be performed in a different order or with different materials. Various resists, developers, and etchants could be used.

The above implementation uses a layout for a cell in an array, but other layouts could be used.

The implementation described above provides circuitry with specific geometric and electric characteristics, but the invention could be implemented with different geometries and with different circuitry.

The implementation described above includes layers of specified thicknesses, produced from specified materials by specified processes, but other thicknesses could be produced, and other materials and processes could be used, such as thinner semiconductor and insulating layers to improve TFT performance or to increase storage capacitance.

The implementation described above includes layers in a specific sequence, but the sequence of layers could be modified.

The invention can be produced as described in copending, coassigned U.S. patent application 08/577,634, entitled "Fabricating Fully Self-Aligned Amorphous Silicon Device," incorporated herein by reference, or in other appropriate ways.

D. Application

The invention could be applied in many ways, including not only active matrix arrays but also other arrays in which very small a-Si TFTs are beneficial. The invention can be applied in active matrix arrays of many different kinds, including display arrays, light valve arrays, and sensor arrays.

E. Miscellaneous

The invention has been described in relation to thin-film implementations, but the invention might be implemented with single crystal technology.

Although the invention has been described in relation to various implementations, together with modifications, variations, and extensions thereof, other implementations, modifications, variations, and extensions are within the scope of the invention. The invention is therefore not limited by the description contained herein or by the drawings, but only by the claims.

What is claimed:

1. In an array that includes:
   a substrate with a surface at which circuitry is formed;
   array circuitry at the surface of the substrate; the array circuitry including cells; each of a set of the cells including an amorphous silicon thin film transistor; the amorphous silicon thin film transistor including:
   a gate region that has first and second edges;
   an insulating layer over the gate region, the insulating layer extending over the first and second edges of the gate region;
   an undoped amorphous silicon layer over the insulating layer; the undoped amorphous silicon layer having first and second parts that extend beyond the first and second edges, respectively, of the gate region;
   an insulating region over the amorphous silicon layer; the insulating region having first and second edges approximately aligned with the first and second edges of the gate region so that the first and second parts of the amorphous silicon layer also extend beyond the first and second edges, respectively, of the insulating region; and
   first and second channel leads formed in a PECVD deposited layer of doped semiconductor material over the first and second parts of the amorphous silicon layer;
   an improvement comprising:
   each of the first and second channel leads overlapping the insulating region by a distance that is no more than a maximum overlap distance; the maximum overlap distance being no more than 1.0 μm.

2. The improvement of claim 1 in which the set of cells includes all the cells.

3. The improvement of claim 1 in which the first and second edges of the insulating region are separated by a distance that is greater than twice the maximum overlap distance.

4. The improvement of claim 3 in which the maximum overlap distance is 0.5 μm.

5. The improvement of claim 1 in which the doped semiconductor material is microcrystalline silicon.

6. The improvement of claim 1 in which the doped semiconductor material is polycrystalline silicon.

7. The improvement of claim 1 in which the insulating region is silicon nitride.

8. The improvement of claim 1 in which the amorphous silicon thin film transistor further comprises:
   first and second conductive metal electrodes over the first and second channel leads, respectively; the first and second conductive electrodes being electrically connected to the first and second channel leads, respectively.

9. An array comprising:
   a substrate with a surface at which circuitry is formed;
   array circuitry at the surface of the substrate; the array circuitry comprising:
   scan lines extending in a first direction;
   data lines extending in a second direction different than the first direction so that each scan line crosses each data line in a crossing region;
   for each crossing region in which one of the scan lines crosses one of the data lines, cell circuitry; each crossing region's cell circuitry including a component and an amorphous silicon thin film transistor for electrically connecting the data line and the component under control of the scan line; each cell's amorphous silicon thin film transistor including:
   a gate region that has first and second edges; the gate region being electrically connected to the scan line;
   an insulating layer over the gate region, the insulating layer extending over the first and second edges of the gate region;
   an undoped amorphous silicon layer over the gate region; the undoped amorphous silicon layer having first and second parts that extend beyond the first and second edges, respectively, of the gate region;
   an insulating region over the amorphous silicon layer; the insulating region having first and second edges approximately aligned with the first and second edges of the gate region so that the first and second parts of the amorphous silicon layer also extend beyond the first and second edges, respectively, of the insulating region;
   first and second channel leads formed in a PECVD deposited layer of doped semiconductor material over the first and second parts of the amorphous silicon layer; each of the first and second channel leads overlapping the insulating region by a distance that is no more than a maximum overlap distance; the maximum overlap distance being no more than 1.0 µm; and first and second conductive electrodes over the first and second channel leads; the first electrode being electrically connected between the data line and the first channel lead; the second electrode being electrically connected between the second channel lead and the cell circuitry's component.

10. The array of claim 9 in which the first electrode has an edge that is separated from the first edge of the insulating region by a first spacing and the second electrode has an edge that is separated from the second edge of the insulating region by a second spacing; each of the first and second spacings being approximately 2 µm.

11. The array of claim 9 in which the scan line and the gate region are both in a first conductive metal layer.

12. The array of claim 9 in which the data line and the first and second electrodes are all in a second conductive metal layer.

13. The array of claim 9 in which the each cell's amorphous silicon thin film transistor further comprises an insulating layer between the gate region and the undoped amorphous silicon layer.

14. In an array that includes:

a substrate with a surface at which circuitry is formed;

array circuitry at the surface of the substrate; the array circuitry including cells; each of a set of the cells including an amorphous silicon thin film transistor; the amorphous silicon thin film transistor including:

a gate region that has first and second edges;

an insulating layer over the gate region, the insulating layer extending over the first and second edges of the gate region;

an undoped amorphous silicon layer over the insulating layer; the undoped amorphous silicon layer having first and second parts that extend beyond the first and second edges, respectively, of the gate region;

an insulating region over the amorphous silicon layer; the insulating region having first and second edges approximately aligned with the first and second edges of the gate region so that the first and second parts of the amorphous silicon layer also extend beyond the first and second edges, respectively, of the insulating region; and first and second channel leads formed in a PECVD deposited layer of doped semiconductor material over the first and second parts of the amorphous silicon layer;

an improvement comprising:

the first channel lead being self-aligned with the first edge of the gate region; the second channel lead being self-aligned with the second edge of the gate region; each of the first and second channel leads overlapping the insulating region by a distance that is greater than zero and that is no more than a maximum overlap distance; the maximum overlap distance being no more than 1.0 µm.

15. The improvement of claim 14 in which the doped semiconductor material is microcrystalline silicon.

16. The improvement of claim 14 in which the doped semiconductor material is polycrystalline silicon.

* * * * *